(12) United States Patent
Baselmans et al.

(10) Patent No.: US 8,189,172 B2
(45) Date of Patent: May 29, 2012

(54) LITHOGRAPHIC APPARATUS AND METHOD

(75) Inventors: Johannes Jacobus Matheus Baselmans, Oirschot (NL); Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 417 days.

(21) Appl. No.: 11/763,275

(22) Filed: Jun. 14, 2007

(65) Prior Publication Data

US 2008/0309899 A1    Dec. 18, 2008

(51) Int. Cl.
| | | |
|---|---|---|
| *G01B 9/02* | (2006.01) | |
| *G03B 27/32* | (2006.01) | |
| *G03B 27/42* | (2006.01) | |
| *G03B 27/54* | (2006.01) | |

(52) U.S. Cl. ............... 355/67; 355/53; 355/77; 356/521
(58) Field of Classification Search ............... 355/53, 355/66, 67, 77; 356/520, 521; 359/566, 359/577

See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,233,056 B1 | 5/2001 | Naulleau et al. | |
| 6,360,012 B1 | 3/2002 | Kreuzer | |
| 6,687,041 B1* | 2/2004 | Sandstrom | 359/291 |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,812,477 B2 | 11/2004 | Matsunami | |
| 6,963,391 B2 | 11/2005 | Van Der Werf et al. | |

(Continued)

FOREIGN PATENT DOCUMENTS

DE        103 16 123 A1    10/2004

(Continued)

OTHER PUBLICATIONS

International Search Report and Written Opinion for International Application No. PCT/EP2008/005086 mailed Sep. 30, 2008, 10 pgs.

(Continued)

*Primary Examiner* — Hung Henry Nguyen
*Assistant Examiner* — Colin Kreutzer
(74) *Attorney, Agent, or Firm* — Sterne, Kessler, Goldstein & Fox P.L.L.C.

(57) ABSTRACT

Systems and methods are provided for measuring aberration in a lithographic apparatus. A radiation beam is modulated using an array of individually controllable elements, and the modulated beam is projected using a projection system. A pattern is provided on the array of individually controllable elements to modulate the radiation beam, and the pattern comprises a repeating structure that is formed from a plurality of features that are dimensioned such that first order diffraction of the radiation beam substantially fills the pupil of the projection system. A sensor detects the projected radiation and measures interference in the radiation projected by the projection system. Aberration in the detected radiation beam is then measured.

19 Claims, 7 Drawing Sheets

U.S. PATENT DOCUMENTS

| | | |
|---|---|---|
| 7,067,784 B1 | 6/2006 | Lowans |
| 7,088,488 B2 | 8/2006 | Edwards |
| 7,354,169 B2 | 4/2008 | Baba-Ali |
| 7,417,745 B2 | 8/2008 | Haidner et al. |
| 7,520,626 B2 | 4/2009 | Baba-Ali |
| 7,580,559 B2 | 8/2009 | Latypov et al. |
| 2004/0041104 A1 | 3/2004 | Liebregts et al. |
| 2004/0114119 A1 | 6/2004 | Van Der Laan et al. |
| 2004/0130561 A1 | 7/2004 | Jain |
| 2005/0007572 A1 | 1/2005 | George et al. |
| 2005/0007602 A1 | 1/2005 | Haidner et al. |
| 2005/0053273 A1 | 3/2005 | Ostrom et al. |
| 2005/0168790 A1 | 8/2005 | Latypov et al. |
| 2005/0179977 A1 | 8/2005 | Chui et al. |
| 2005/0200940 A1 | 9/2005 | Emer |
| 2005/0219502 A1* | 10/2005 | Sandstrom et al. ............. 355/77 |
| 2005/0254024 A1 | 11/2005 | Marie Van Greevenbroek et al. |
| 2005/0259269 A1 | 11/2005 | Latypov et al. |
| 2006/0001890 A1* | 1/2006 | Poultney ...................... 356/521 |
| 2006/0012779 A1 | 1/2006 | Hinnen et al. |
| 2006/0103826 A1* | 5/2006 | Kok et al. ....................... 355/67 |
| 2006/0109576 A1 | 5/2006 | Baba-Ali |
| 2006/0146302 A1 | 7/2006 | Hauschild |
| 2006/0198013 A1 | 9/2006 | Sampsell |
| 2006/0238737 A1 | 10/2006 | Nakauchi |
| 2006/0290910 A1* | 12/2006 | Van De Kerkhof et al. .... 355/53 |
| 2008/0309898 A1* | 12/2008 | Baselmans ...................... 355/52 |
| 2009/0021748 A1 | 1/2009 | Latypov et al. |

FOREIGN PATENT DOCUMENTS

| | | |
|---|---|---|
| EP | 1 063 570 A2 | 12/2000 |
| EP | 1 482 371 A1 | 1/2004 |
| EP | 1 482 371 A1 | 12/2004 |
| JP | 2001-057337 A | 2/2001 |
| JP | 2006-019753 A | 1/2006 |
| WO | WO 98/33096 A1 | 7/1998 |
| WO | WO 98/38597 A2 | 9/1998 |
| WO | WO 98/38597 A3 | 9/1998 |

OTHER PUBLICATIONS

Non-Final Rejection mailed Aug. 18, 2009 for U.S. Appl. No. 11/763,274, 20 pgs.

Final Rejection mailed Dec. 18, 2009 for U.S. Appl. No. 11/763,274, 22 pgs.

English-Language Abstract for Japanese Patent Publication No. 2001-057337 A, published Feb. 27, 2001; 1 page.

English-Language Abstract for Japanese Patent Publication No. 2006-019753 A, published Jan. 19, 2006; 1 page.

English-Language Translation of Notice of Reasons for Rejection directed to related Japanese Patent Application No. 2010-511547, mailed Dec. 5, 2011, from the Japanese Patent Office; 3 pages.

\* cited by examiner

LITHOGRAPHIC APPARATUS AND METHOD

BACKGROUND

1. Field of the Invention

The present invention relates to an apparatus and method for measurement in a lithographic apparatus.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Lithography requires the projection of patterns onto a substrate with a high degree of accuracy. In order to ensure that projection is achieved at this degree of accuracy, the lithographic apparatus may perform various calibration measurements, and in some instances, the lithographic apparatus may be adjusted in response to these measurements.

Conventional lithographic apparatus often use transmissive reticles. However, in some proposed lithographic apparatus, the transmissive reticles have been replaced with arrays of individually controllable elements, such as mirrors. In these non-conventional lithographic apparatus, conventional calibration measurement systems and methods may no longer be suitable or may no longer be optimal.

Therefore, what is needed is a system and method that measure interference of radiation beams projected by projection systems within lithographic apparatus using arrays of individually controllable elements.

SUMMARY

In one embodiment of the present invention, there is provided a apparatus and method for measuring aberration in a lithographic apparatus.

In another embodiment of the present invention, there is provided a lithographic apparatus comprising an array of individually controllable elements, a projection system, a sensor, and a controller. The array of individually controllable elements is configured to modulate a beam of radiation. The projection system is configured to project the modulated beam of radiation. The sensor is arranged to detect radiation projected by the projection system measure interference in the projected radiation. The controller is arranged to provide a pattern on the array of individually controllable elements to modulate the radiation beam. The pattern comprises a repeating structure and is formed from a plurality of features, which are dimensioned such that first order diffraction of the radiation beam substantially fills the pupil of the projection system.

According to a further embodiment of the present invention, there is provided a method that measures aberration present in a lithographic apparatus. The method comprises modulating a radiation beam using an array of individually controllable elements, projecting the radiation beam using a projection system, detecting the projected radiation using a sensor, and measuring aberration in the detected radiation beam. A pattern is provided on the array of individually-controllable elements. The pattern comprises a repeating structure and is formed from a plurality of features, the features being dimensioned such that first order diffraction of the radiation beam substantially fills the pupil of the projection system, and wherein the sensor is arranged to measure interference in the radiation projected by the projection system.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 8A:
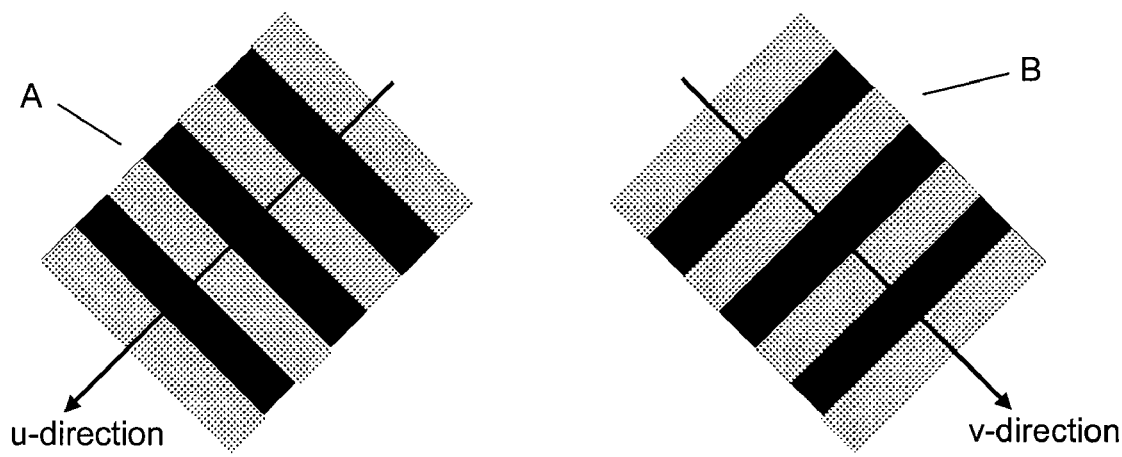
Figure 8B:
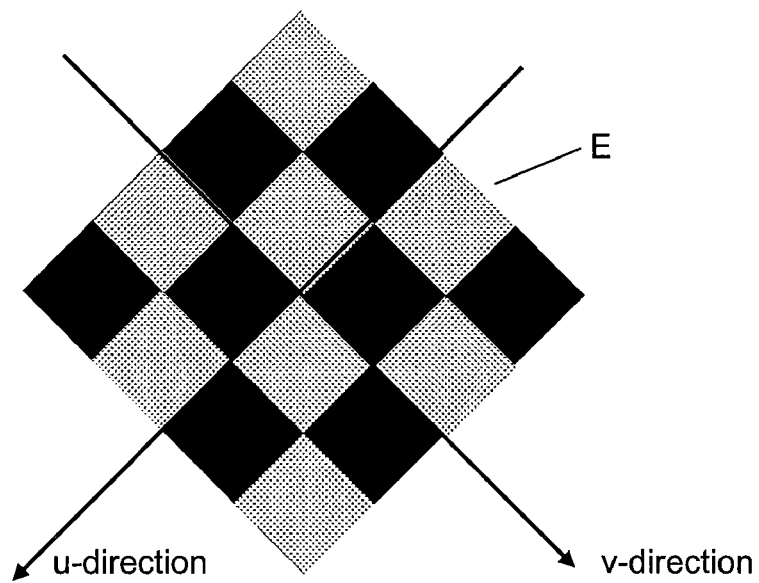

FIGS. 8a and 8b describes the movement of a sensor beneath a pattern.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
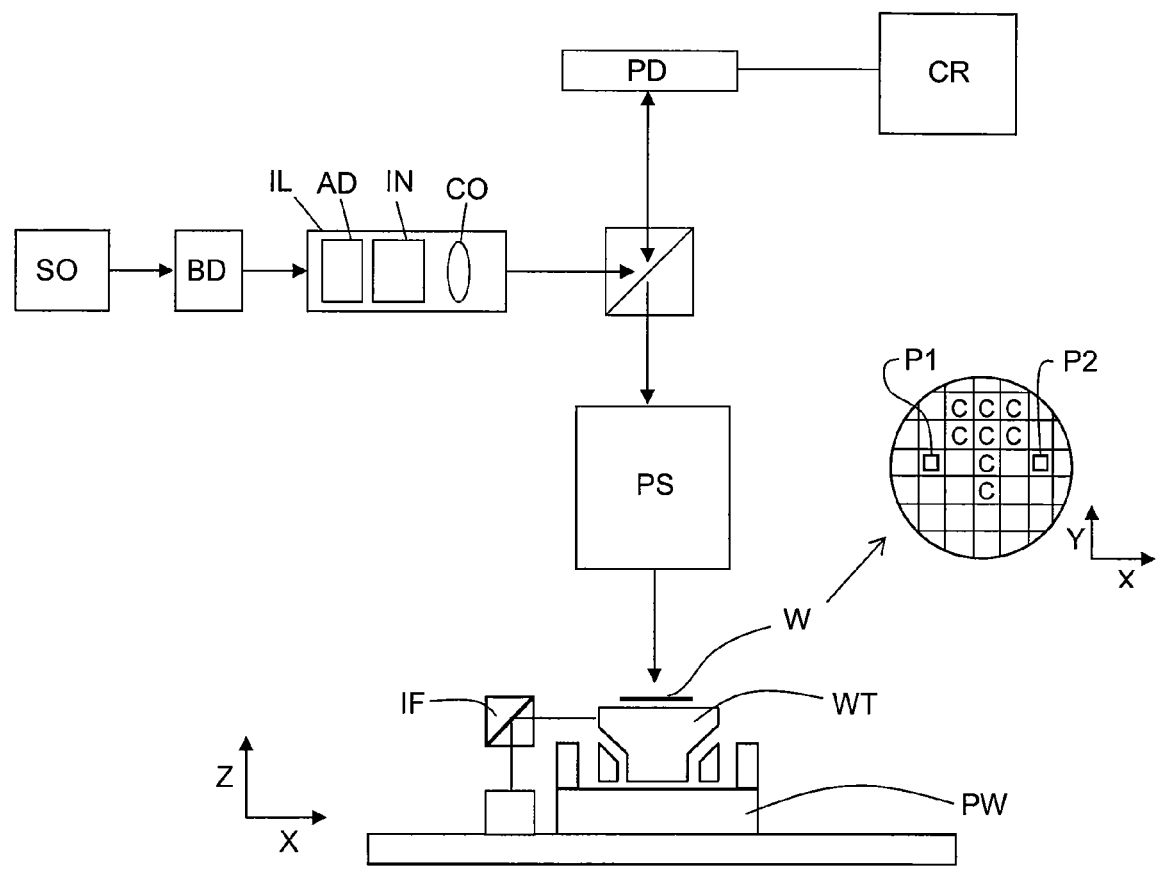
FIG. 1 depicts a lithographic apparatus.

FIG. 1 schematically depicts the lithographic apparatus 1 of one embodiment of the invention. The apparatus comprises an illumination system IL, a patterning device PD, a controller CR, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The patterning device PD is connected to a controller CR that is configured to control the pattern provided on the patterning device. For example, controller CR may switch between a series of desired patterns on patterning device PD.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
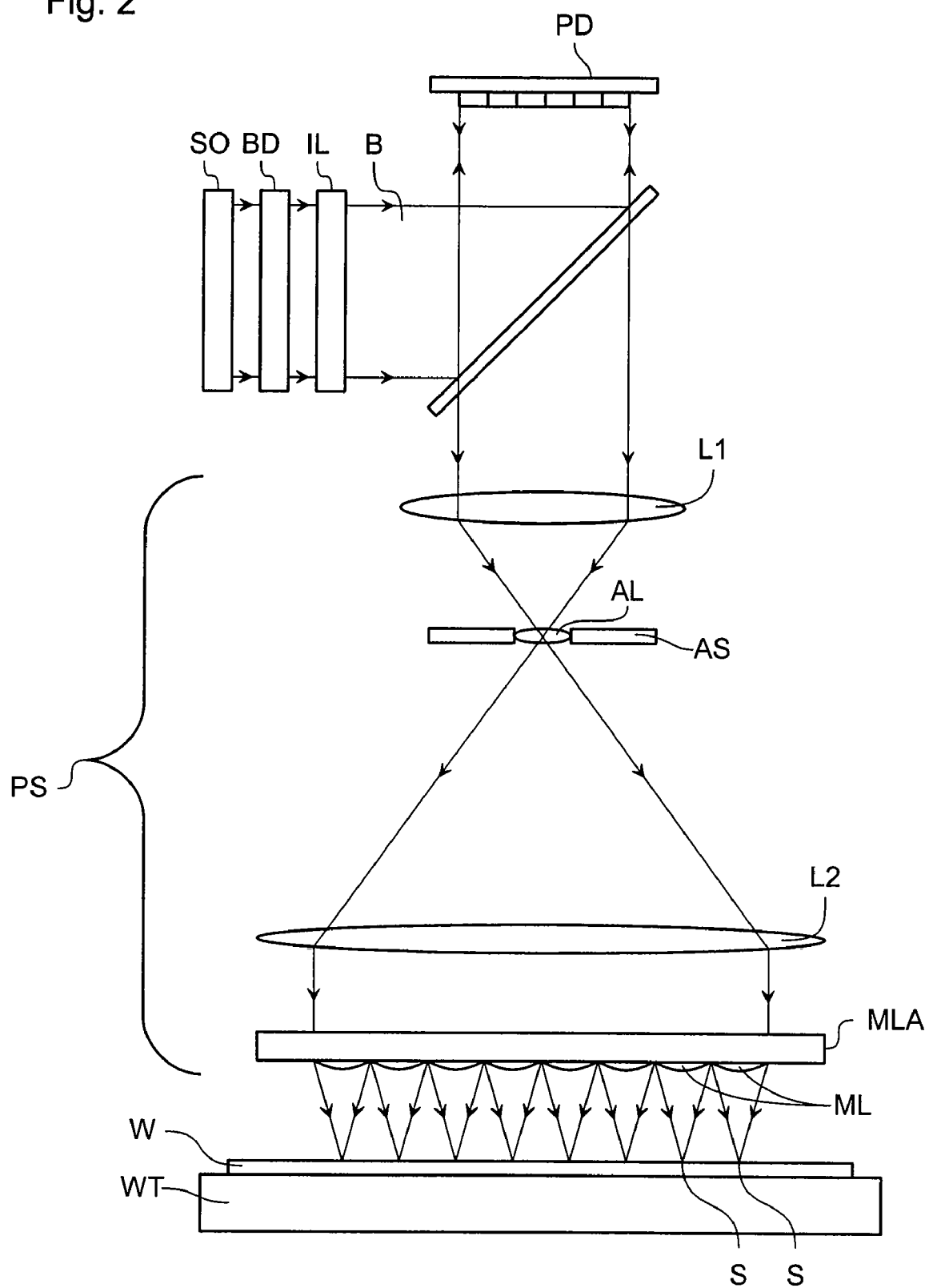
FIG. 2 depicts a lithographic apparatus.

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage of the exposure process. Therefore, control signals representing the requisite states must be transmitted to each of the individually controllable elements. These control signals are provided by the controller CR (FIG. 1). The pattern to be formed on the substrate may be provided to the lithographic apparatus in a vector-defined format, such as GDSII. In order to convert the design information into the control signals for each individually controllable element, the controller includes one or more data manipulation devices, each of which are configured to perform a processing step on a data stream that represents the pattern. The data manipulation devices may collectively be referred to as the "datapath".

The data manipulation devices of the datapath may be configured to perform one or more of the following functions: (i) converting vector-based design information into bitmap pattern data; (ii) converting bitmap pattern data into a required radiation dose map, i.e., a required radiation dose profile across the substrate; (iii) converting a required radiation dose map into required radiation intensity values for each individually controllable element; and (iv) converting the required radiation intensity values for each individually controllable element into corresponding control signals.

Lithography requires a projection of patterns onto a substrate with high accuracy. In order to ensure that projection is achieved with high accuracy, various calibration measurements are made within the apparatus. In some instances adjustments of the apparatus are made in response to these measurements.

One such calibration measurement performed by a conventional lithography apparatus is a measurement of the aberration present in the radiation beam projected by the projection system PS. In one embodiment, lateral shearing interferometry may be used to measure the aberrations. In shearing interferometry, a wavefront is separated into several copies. These copies are displaced laterally with respect to one another, and interference between them is recorded. An analysis of the interference is used to monitor aberrations within the radiation beam, and in one embodiment, shearing interferometry may be performed conveniently within a maskless lithographic apparatus.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
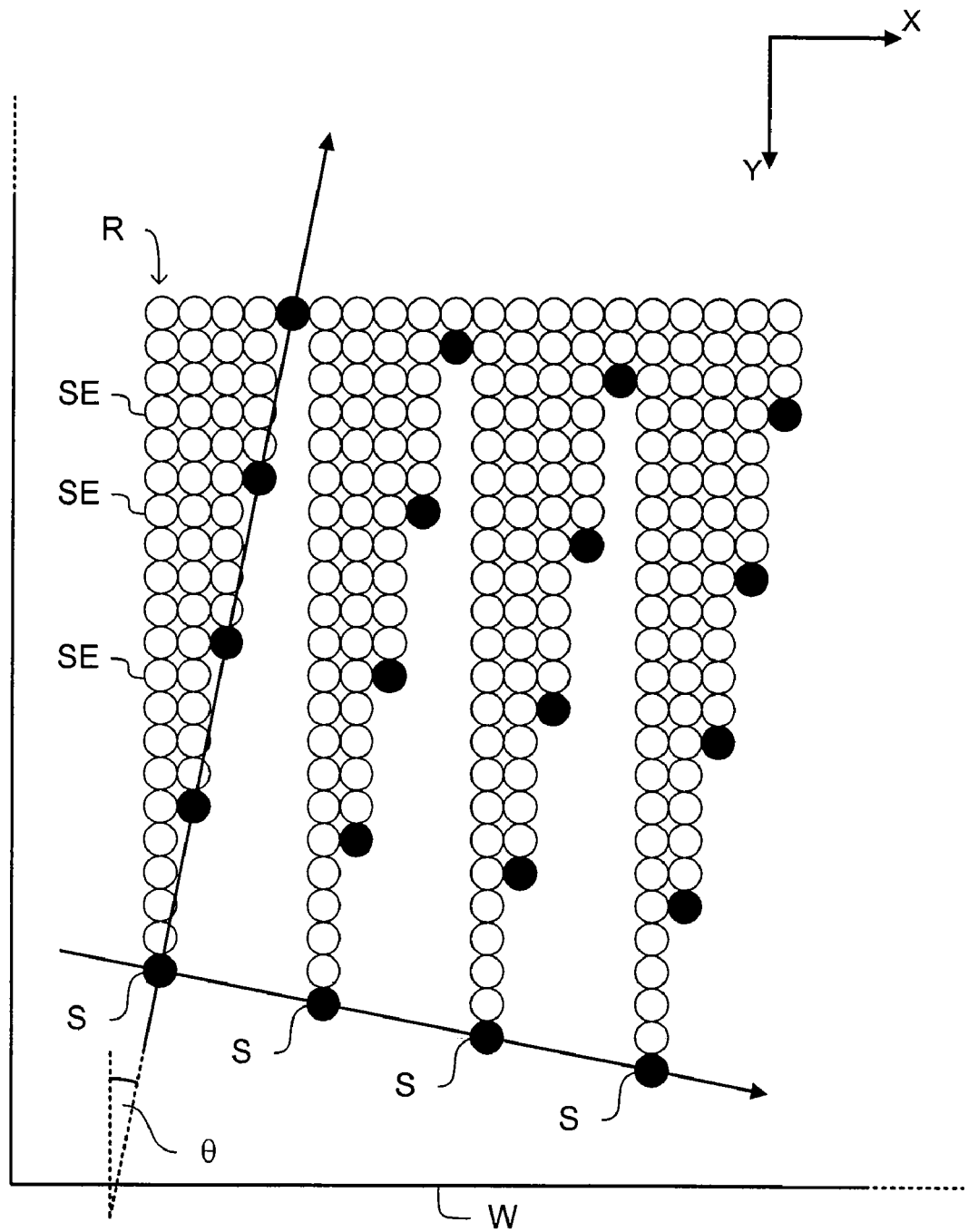
FIG. 3 depicts a mode of transferring a pattern to a substrate as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle $\theta$ can be at most 20°, at most 10°, at most 5°, at most 3°, at most 1°, at most 0.5°, at most 0.25°, at most 0.10°, at most 0.05°, or at most 0.01°. Alternatively, the angle $\theta$ is at least 0.001°.

Figure 4:
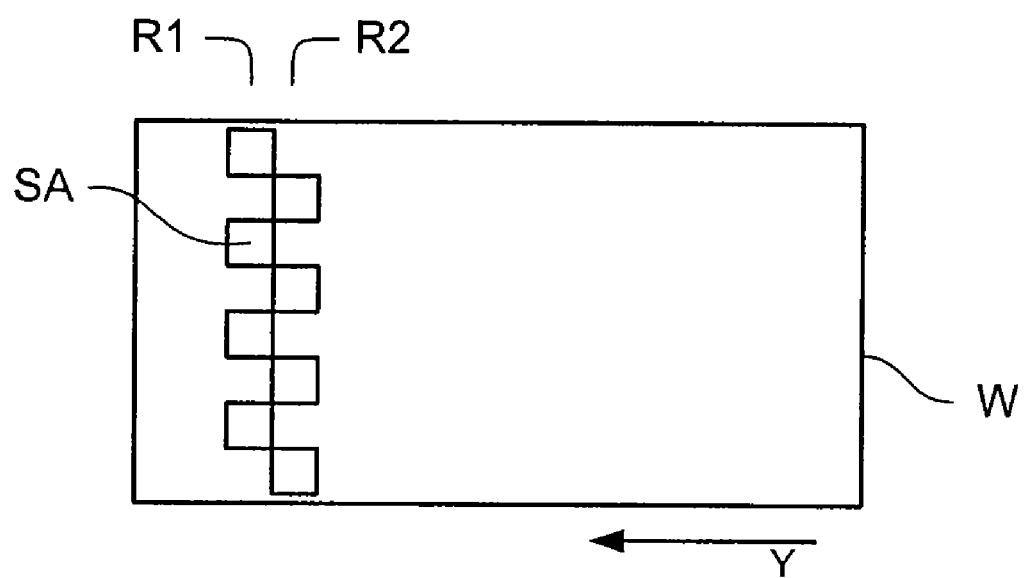
FIG. 4 depicts an arrangement of optical engines.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
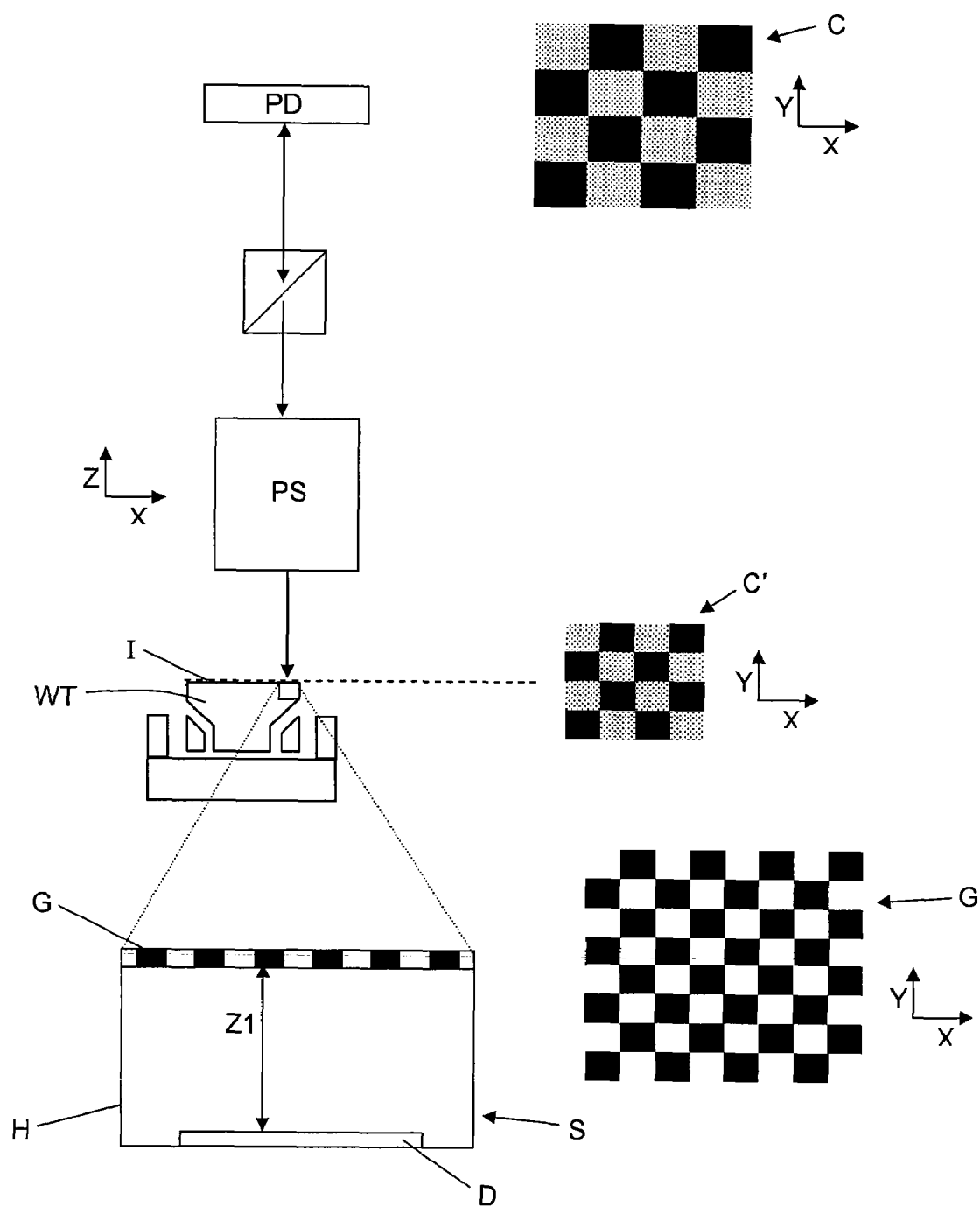
FIG. 5 depicts of an exemplary portion of the lithographic apparatus described above with respect to FIG. 1.

FIG. 5 depicts of a portion of the lithographic apparatus described above with respect to FIG. 1. In FIG. 5, the substrate table WT is provided with a sensor S, and the sensor S comprises a housing H containing a detector D, such as a CCD array. A diffraction grating G is attached to the housing H, and the diffraction grating G comprises a checkerboard pattern provided on a quartz plate. The diffraction grating G may be located above the detector D at a distance Z1 from the detector, and in one example, the distance Z1 may be approximately 2.5 millimeters. Further, the detector D may be located in the far field of the projection system PS, and the detector D outputs a modulated signal, which is passed to a processor (not depicted in FIG. 5).

In FIG. 5, a checkerboard pattern C is provided on the patterning device PD. In one embodiment, the pattern C does not cover the entire patterning device, but instead has a limited spatial extent. Dark areas of the checkerboard pattern indicate areas where mirrors, or other individually controllable elements, direct radiation, such that it does not pass through the projection system PS. Dotted areas of the checkerboard indicate areas in which the mirrors of the patterning device are oriented, such that radiation is directed into the projection system. The mirrors in these areas, hereafter referred to as light areas, are not all oriented to direct radiation into the projection system. Instead, the mirrors in the light areas are arranged to form randomly positioned features, while the regions surrounding these randomly positioned features remain dark, i.e., radiation is not directed from these regions into the projection system.

The projection system PS forms an image C' of the checkerboard pattern C in an image plane I. In one embodiment, the reduction factor of the projection system is 400, thereby implying that the image of the checkerboard pattern C' formed by the projection system is 400 times smaller than the checkerboard pattern C formed by the mirrors. For example, the checkerboard pattern C may be approximately 16 millimeters across, and a corresponding image of the checkerboard pattern C' may be approximately 40 microns across. Further, as the checkerboard pattern C has a limited spatial extent, so does the image of the checkerboard pattern C'.

In practice, the substrate table WT may be moved such that the grating G, which acts as a shearing grating, coincides with the image of the checkerboard pattern C'. The limited spatial extent of the checkerboard pattern image C', coupled with the separation Z1 of the detector D from the image plane of the projection system PS, imply that the sensor S acts as a pinhole camera. Therefore, interference from sheared wavefronts of the radiation beam is imaged on the detector D.

Further, the substrate table WT may be moved transverse to the radiation beam such that it passes beneath the checkerboard pattern image C'. The interaction between the checkerboard pattern image C' and the grating G provides a plurality of overlapping wavefronts. Interference between these wavefronts will occur, and aberrations present in the wavefronts will modify the resulting interference patterns. The processor then measures the aberration present in the radiation beam by detecting the phase of the first harmonic of the modulated signal.

In various embodiments, the checkerboard pattern C has properties that assist in obtaining accurate aberration measurements. The first of these properties relates to filling the pupil of the projection system PS. In order to measure the aberration across the full wavefront of the radiation beam at substrate level, the radiation beam should pass through the entire pupil of the projection system PS. As previously described, the light areas of the checkerboard pattern are formed from randomly positioned features that are surrounded by dark regions, and the size of these features is selected such that radiation diffracted by the features substantially fills the pupil of the projection system. The term "substantially fills" is intended to mean, for example, that the pupil of the projection system is filled sufficiently to allow an accurate aberration measurement. The size of the features is such that a majority of first-order diffracted radiation passes through the projection system, i.e., does not fall outside of the pupil of the projection system, and the features are formed from groups of mirrors on the patterning device PD.

For example, the features may be considered to be discs, and pupil filling may be considered in terms of the Airy disk diffraction function generated by each disc of the patterning array. An Airy disk is usually described as being caused by radiation passing through a circular aperture. However, an Airy disk would also be formed if radiation were reflected from a circular mirror or a reflective disk formed by a plurality of mirrors. The size of an Airy disk (in the pupil plane) may be defined as follows:

$$\mathrm{Sin}\theta = 1.22\frac{\lambda}{d}, \quad (1)$$

where $\lambda$ is the wavelength of the radiation, d is the diameter of the reflective disk formed by the mirrors in the image plane I, and $\theta$ is the angle at which the first minimum of intensity of the Airy disk is seen.

In one embodiment, it is desirable to ensure that the pupil of the projection system PS is filled. However, it is also desirable to minimize the amount of radiation that is diffracted at an angle that is too large to be captured by the projection system. Based on these constraints, an appropriate diameter d of the reflective disk may be determined. To fill the pupil, $\theta$ should be greater than or equal to $\sqrt{2}\times NA$, where NA is the numerical aperture of the lens. In one embodiment NA=1.35 and $\lambda$=1.93 nm, and further, NA is greater than one because the final lens of the projection system PS is immersed in fluid. Upon rearrangement, equation 1 yields:

$$d = \frac{1.22\lambda}{\sqrt{2}\,NA}. \quad (2)$$

Using this equation, the desired diameter of the reflective disk in the image plane I is about 123 nm. Since the lithographic apparatus has a reduction factor of about 400, this corresponds to a diameter of about 49 microns at the patterning device PD. Further, if each mirror is about 8 microns across, then the reflective disk at its widest point will measure about 6 mirrors across.

The disclosed embodiments are not limited to features considered to be disks, and in additional embodiments, other features shapes may be used, including, but not limited to, squares, rectangles, hexagons, etc. However, if a feature shape other than a disk is used, then the envelope defined by the diffraction pattern will be different from that obtained when the feature shape is a disk. For example, if square feature shapes are used, the diffraction pattern will be a sine function. In further embodiments, the individual features may not share a common shape.

The features of the light areas of the checkerboard pattern C are randomly distributed, thereby providing a uniform distribution of the radiation beam within the projection system PS. If the features were not randomly distributed, but were instead positioned in a regular or structured manner, then unwanted diffraction patterns would be present in the radiation beam. As such, the radiation beam would no longer be uniformly distributed in the pupil of the projection system. In some instances, too much non-uniformity in the radiation beam may introduce unwanted artifacts into the aberration measurement.

In practice, the radiation beam that illuminates the checkerboard pattern C on the patterning device PD may have an annular mode, a dipole mode, a quadrupole mode, or any additional mode. Therefore, the checkerboard pattern may be illuminated by radiation from many different angles, and the features in the checkerboard pattern may act to scatter and/or diffract the radiation beam. In such an instance, zero-diffraction order radiation will be present that has not been scattered and/or diffracted by the features, thus passing through the projection system PS In one embodiment, the phases of the features within checkerboard pattern C may be selected to substantially eliminate (or reduce) the amount of zero-diffraction order radiation that is coupled into the projection system. For example, by arranging the features of the checkerboard pattern such that they generate equal amounts of radiation with positive phase and negative phase, the zero-diffraction order radiation may be cancelled out.

Figure 6:
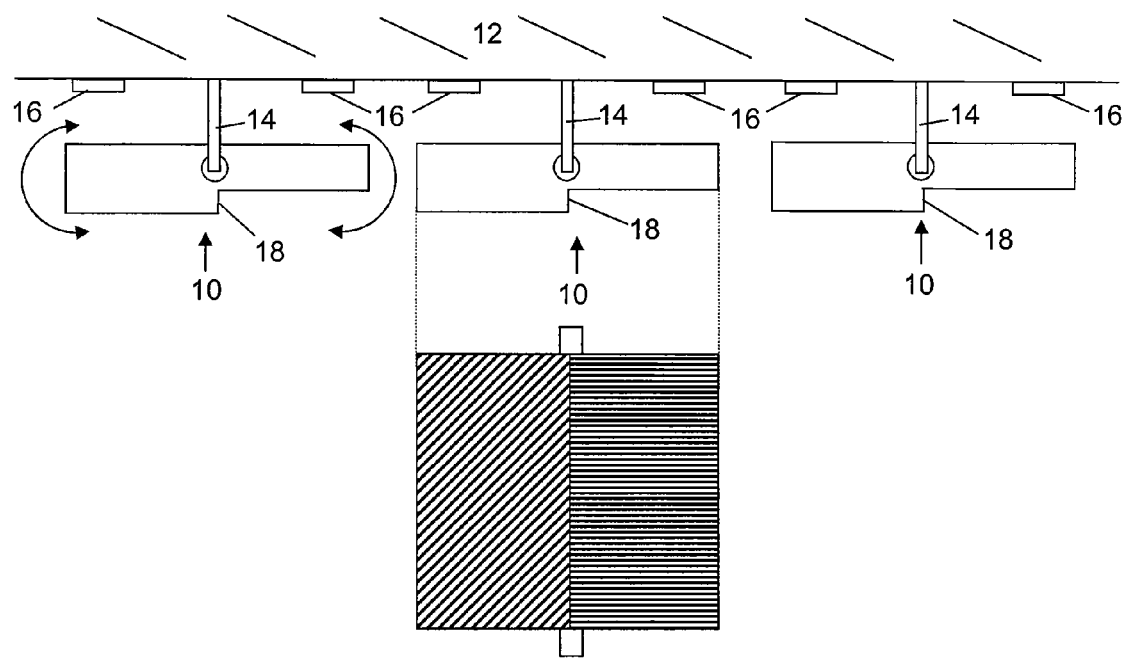
FIG. 6 depicts an exemplary array of mirrors that cancels out zero-diffraction order radiation.

FIG. 6 depicts a portion of an exemplary array of mirrors that cancels out zero-diffraction order radiation according to an embodiment of the invention. In particular, FIG. 6 depicts a side view of three mirrors 10 of the patterning device PD and an overhead view of one of the mirrors 10. In FIG. 6, the mirrors are supported on a substrate 12 and attached to the substrate by legs 14. The connection between the legs 14 and each mirror 10 allows each mirror is able to rotate in the plane of the figure, as indicated by curved arrows next to one of the mirrors. Electrodes 16 are located on the substrate 12 adjacent to the mirrors 10, and the electrodes 16 are connected to a controller (not shown in FIG. 6) that applies voltages to the electrodes. Electric fields generated by the electrodes 16 adjust the orientation and rotation of the mirrors 10.

Half of the reflecting surface of each mirror 10 is raised with respect of the other half, and as such, a step 18 exists between two halves of the reflective surface of the mirror. The height of this step 18 is equal to one quarter of the wavelength of the radiation beam. For example, a radiation beam may have a wavelength 193 nm, and a corresponding height of step 18 would be one quarter of 193 nm. As viewed from above, the left hand side of the mirror (shaded with diagonal lines) has a reflective surface that is raised relative to the right hand side of the mirror (shaded with horizontal lines). This phase step is present in each mirror and may select the phase of radiation directed into the projection system PS by the mirrors of the patterning device PD.

Figure 7:
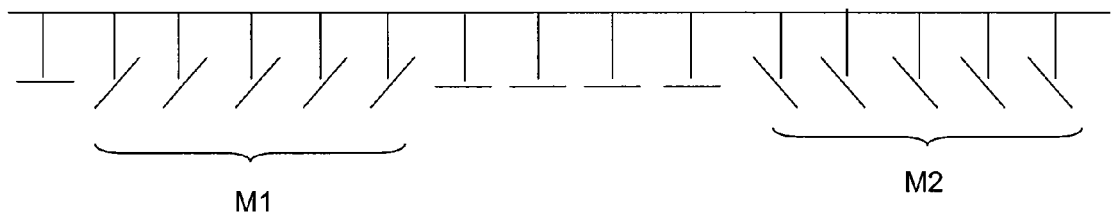
FIG. 7 depicts a second exemplary array of mirrors that cancels out zero-diffraction order radiation.

FIG. 7 depicts a portion of a second exemplary array of mirrors that cancels out zero-diffraction order radiation according to an additional embodiment of the invention. FIG. 7 depicts schematically fifteen mirrors in cross section, and each mirror in FIG. 7 is depicted on a smaller scale than those in FIG. 6. The fifteen mirrors described in FIG. 7 may represent a small portion of the mirrors provided in a typical mirror array, which may comprise a million or more individual mirrors. As described above in reference to FIG. 5, orienting a set of mirrors in a given direction may form each of the features in the light areas of the checkerboard pattern C. For example, the Airy disk equation, it may indicate that each feature should comprise a square measuring five mirrors by five mirrors.

In order to direct radiation into the projection system PS, thereby forming a feature visible to the detector D, the mirrors must be rotated either clockwise or anti-clockwise at a particular angle. In the embodiment of FIG. 7, rotating a set of mirrors M1 in a clockwise direction forms one feature, whereas rotating a different set of mirrors M2 in an counter-clockwise direction forms a second feature. Due to the phase step provided on each mirror, the resulting features have opposing phases. Since the two features have opposite phase, any zero-order radiation cancels out, and as such, no zero order radiation reaches the sensor S. The present invention is not limited to mirror arrays having two features, and in additional embodiments, sets of mirrors may be rotated to form any number of features.

Therefore, when orienting the mirrors 10 to form features seen by the detector D, the controller CR orients the mirrors such that half of the features are formed from mirrors with a first orientation and half of the features are formed from mirrors with an opposite orientation. As such, half of the features have a positive phase and half of the features have a negative phase, and all zero-order radiation cancels out. Further, the term "tone" is sometimes used to refer to the phase, and in the embodiment of FIG. 7, half of the features have a tone which is opposite to the tone of the other half of the features.

FIGS. 8a and 8b depict the movement of sensor S beneath a pattern, such as the checkerboard pattern described above in reference to FIG. 5. FIG. 8a describes the measurement of aberrations using a simplified pair of patterns. In FIG. 8a, a first pattern A comprises a series of lines spaced apart in the u-direction. This pattern is formed on the patterning device PD, and as described above, light areas of the pattern comprise randomly-positioned features with appropriate dimensions.

The sensor S is stepped in the u-direction beneath an image of the pattern A. One image is recorded per step, and the intensity of the image is recorded as a function of the stepped distance. Stepping in this manner provides multiple interferograms with different phases. The phase of the first harmonic of the image intensity as a function of distance is determined, and this phase provides information about aberrations present in the projection system.

A second pattern B, which comprises a series of lines spaced apart in the v-direction, is then formed on the patterning device PD. As was described above, light areas of the pattern comprising randomly positioned features with appropriate dimensions. The sensor S is stepped in the v-direction beneath an image of the pattern, thereby providing a second set of aberration measurements in the v-direction.

In FIG. 8b, the separate series of spaced lines described in FIG. 8a have been replaced by a checkerboard pattern E. As described with respect to FIG. 5, light areas of the pattern comprise randomly positioned features with appropriate dimensions. The checkerboard pattern of FIG. 8b allows aberration measurements to be performed for the u and v directions without having to modify the pattern between measurements.

The aberration measurements may performed in FIG. 8b in a manner similar to that described above with respect to FIG. 8a. However, in addition to stepping movement in one direction (e.g., the u-direction), scanning movement also takes place in the other direction (e.g., the v-direction). The scanning movement takes place during each intensity measurement and is used to average out one dimension of the checkerboard structure. Accordingly, the resulting aberration measurement is in one direction only (e.g., the u-direction).

Although the patterns described in FIGS. 8a and 8b have well defined edges exhibiting sharp transitions between light areas and dark areas, additional embodiments may feature patterns that exhibit gradual transitions between light areas and dark areas. For example, the patterns may be in the form of cosine functions. As such, the maximum of the cosine function may correspond to a maximum number of features being present, and a minimum of the cosine function may correspond to a minimum number of features being present (e.g., zero features). Further, the use of patterns in the form of cosine functions simplifies the determination of the first harmonic of the modulated signal output, as the modulated signal does not include significant amounts of other harmonics. If a pattern with well defined edges is used, such as that described above in FIGS. 8a and 8b, then a number of additional harmonics may be present, and a denser sampling of the modulated signal may be necessary to obtain accurate aberration measurements.

In additional embodiments, a pattern may include a repeating structure selected such that interference with sufficient contrast is seen at the detector D. The resulting interference pattern should have sufficient contrast to allow it to be detected accurately by the detector.

In one example, the radiation source SO of the lithographic apparatus may be pulsed. In such a case, multiple pulses of the radiation source SO will occur during an aberration measurement, and the features that comprise the light areas of a pattern used for an aberration measurement may change during measurement. The overall pattern (e.g., checkerboard, stripes, etc.) will stay the same, but the positions of the features may change. The changes in feature position may occur after several pulses of the lithographic apparatus, or alternatively, after every pulse of the lithographic apparatus. By changing the positions of the features, any speckle present in the radiation beam may be averaged out.

Further, the period of the grating G may be selected in order to optimize the contrast and intensity of the interferograms seen by the detector D. For example, if two separated illumination points are present at the patterning device PD (e.g., a dipole illumination mode), then two interferograms will be generated by the grating G. If the period of the grating G were selected such that it is the same as the separation between the two illumination points (as seen in the image plane I), then the interferograms would add together constructively and provides a signal with strong contrast. However, if the period of the grating G were half of the separation between the two illumination points, then the interferograms would add together destructively to provide a signal with little or no contrast.

In an additional embodiment, a linear grating may replace the checkerboard grating, and the period of the linear grating may be selected to provide a strong signal to noise ratio.

In further embodiments, the grating may take the form of a cosine function in those instances where the patterns take the form of cosine functions. In such a case, a period of the cosine function may be selected such that no contrast will be present in the undesired, higher harmonics.

In yet another embodiment, measurement of the aberration present in the radiation beam may be performed at intervals. The time elapsed between aberration measurements may be selected based upon known characteristics of the lithographic apparatus, and the elapsed time may vary between different types and/or models of lithographic apparatuses. For example, the measurement may be performed after a batch or lot of substrates has passed through the lithographic apparatus, and in one embodiment, a batch or lot may comprise 20-25 substrates. The measurement may be performed around 6 times per hour, or at any other interval apparent to one skilled in the relevant arts.

In an embodiment, the controller may provide a pattern at the patterning device PD that is suitable for measuring other properties of the lithographic apparatus. For example, one or more alignment marks may be formed as patterns on the patterning device, and these alignment marks may allow the substrate table WT to be aligned with respect to the patterning device. Further, if the patterning device comprises more than one array of mirrors, the alignment marks may be used to measure the respective locations and orientations of the arrays of mirrors. The alignment marks may comprise squares or other shapes for coarse alignment measurements and gratings for fine alignment measurements.

In an additional embodiment, the patterning device may provide a pinhole or equivalent structure that may be useful in qualifying the illumination system. The alignment marks, or other patterns provided on the patterning device, may be different for different configurations of the lithographic apparatus. For example, the patterns provided may differ for different illumination modes used by the lithographic apparatus.

The results of measurements obtained using various embodiments of the invention may be used to modify or offset a product pattern to be projected onto a substrate.

Further, the patterning device may be used to project information that changes from die to die, or from substrate to substrate. For example, the information may for example comprise an identification number including, but not limited to, an identification number.

Although described embodiments of the invention refer to mirror arrays, any suitable array of individually controllable elements may be used.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method of measuring aberration in a lithographic apparatus, the method comprising:
   modulating a radiation beam using an array of individually controllable elements;
   projecting the modulated radiation beam using a projection system;
   detecting the projected radiation using a moveable sensor; and
   measuring aberration in the detected radiation beam,
   wherein a pattern is provided on the array of individually controllable elements to modulate the radiation beam, wherein the pattern has a repeating structure and is formed from a plurality of features, wherein the plurality of features are dimensioned to generate first order diffraction of the radiation beam that substantially fills the pupil of the projection system, and wherein the moveable sensor steps through and captures an image of an interference pattern in the radiation projected by the projection system, captures an intensity of the image as a function of a stepped distance per step, determines a phase of a first harmonic of the intensity as a function of stepped distance and determines aberrations in the lithographic apparatus based on the phase of the first harmonic.

2. The method of claim 1, wherein the features are randomly positioned.

3. The method of claim 1, wherein adjacent features are spaced apart from one another and do not overlap.

4. The method of claim 1, wherein the features measure less than $$1.22 \frac{\lambda}{\sqrt{2}\,NA}$$

across, where $\lambda$ is a wavelength of the radiation beam, and NA is the numerical aperture of the projection system.

5. The method of claim 1, wherein the features substantially eliminate zero order diffracted radiation through destructive interference.

6. The method of claim 5, wherein substantially half of the features provide radiation with a first phase, and substantially half of the features provide radiation with a second phase, which is opposite to the first phase.

7. The method of claim 6, wherein the individually controllable elements are mirrors having a phase step, and wherein substantially half of the features have a first orientation, and substantially half of the features have an opposite orientation.

8. The method of claim 1, wherein positions of the features change between pulses of the radiation beam.

9. The method of claim 1, wherein the features are disks, squares, rectangles or hexagons.

10. The method of claim 1, wherein the pattern has regularly repeating light areas and dark areas.

11. The method of claim 10, wherein the features are distributed to form the light areas and dark areas.

12. The method of claim 10, wherein the regularly repeating light areas and dark areas form (i) a checkerboard pattern or (ii) one or more series of stripes.

13. The method of claim 10, wherein an intensity variation between the light areas and the dark areas has a cosine function shape.

14. The method of claim 1, wherein the aberration is determined by detecting a first harmonic from a first interference pattern in the plurality of interference patterns.

15. The method of claim 1, wherein a grating forms part of the moveable sensor, and wherein the plurality of interference patterns is generated by the grating.

16. The method of claim 1, wherein the features are formed from groups of individually controllable elements.

17. A lithographic apparatus comprising:
an array of individually controllable elements configured to modulate a beam of radiation;
a projection system configured to project the modulated beam of radiation;
a moveable sensor arranged to detect radiation projected by the projection system; and
a controller arranged to provide a pattern on the array of individually controllable elements;
wherein the pattern has a repeating structure and is formed from a plurality of features, wherein the plurality of features are dimensioned to generate first order diffraction of the radiation beam that substantially fills the pupil of the projection system, and wherein the moveable sensor is arranged to step through and captures an image of an interference pattern in the radiation projected by the projection system, captures an intensity of the image as a function of a stepped distance per step, determines a phase of a first harmonic of the intensity as a function of stepped distance and determines aberrations in the lithographic apparatus based on the phase of the first harmonic.

18. The lithographic apparatus of claim 17, wherein the individually controllable elements are mirrors having a phase step, and wherein substantially half of the features are formed using mirrors having a first orientation, and substantially half of the features are formed using mirrors having a second orientation, which is opposite to the first orientation.

19. The lithographic apparatus of claim 17, wherein the moveable sensor comprises a detector and a grating, wherein the grating is positioned away from the detector, and wherein the grating is in an image plane of the projection system and the detector is in the far field.

* * * * *